US012700874B2

(12) United States Patent　　　　(10) Patent No.:　US 12,700,874 B2
Kakizaki et al.　　　　　　　　　　(45) Date of Patent:　　　Aug. 4, 2026

---

(54) ENCODING CIRCUIT, DECODING CIRCUIT, ENCODING METHOD, DECODING METHOD, AND COMPUTER PROGRAM

(71) Applicant: NTT, Inc., Tokyo (JP)

(72) Inventors: Takeshi Kakizaki, Musashino (JP); Masanori Nakamura, Musashino (JP); Fukutaro Hamaoka, Musashino (JP)

(73) Assignee: NTT, Inc., Tokyo (JP)

( * ) Notice: Subject to any disclaimer, the term of this patent is extended or adjusted under 35 U.S.C. 154(b) by 85 days.

(21) Appl. No.: 18/716,635

(22) PCT Filed: Dec. 8, 2021

(86) PCT No.: PCT/JP2021/045139
　　§ 371 (c)(1),
　　(2) Date: Jun. 5, 2024

(87) PCT Pub. No.: WO2023/105685
　　PCT Pub. Date: Jun. 15, 2023

(65) Prior Publication Data
　　US 2025/0038767 A1　　Jan. 30, 2025

(51) Int. Cl.
　　*H03M 9/00*　　　(2006.01)
　　*H03M 7/30*　　　(2006.01)
　　*H03M 13/11*　　(2006.01)
(52) U.S. Cl.
　　CPC ....... *H03M 7/6005* (2013.01); *H03M 7/6011* (2013.01); *H03M 9/00* (2013.01); *H03M 13/1125* (2013.01)
(58) Field of Classification Search
　　CPC .... H03M 7/6005; H03M 7/6011; H03M 9/00; H03M 13/1125; H03M 13/1515; H03M 13/152; H03M 13/29

(Continued)

(56) References Cited

U.S. PATENT DOCUMENTS 7,010,738 B2 *　3/2006　Morioka ............. H03M 13/158
　　　　　　　　　　　　　　　　　　　708/492
9,166,739 B2 *　10/2015　Sakai ................ H03M 13/1515

(Continued)

FOREIGN PATENT DOCUMENTS

CN　　108270515 A　　7/2018
CN　　111200441 A　　5/2020

(Continued)

OTHER PUBLICATIONS

Georg Bocherer et al., Bandwidth Efficient and Rate-Matched Low-Density Parity-Check Coded Modulation, IEEE Transactions on Communications, vol. 63, No. 12, Dec. 2015, pp. 4651-4665.

(Continued)

*Primary Examiner* — Jean B Jeanglaude
(74) *Attorney, Agent, or Firm* — Harness, Dickey & Pierce, P.L.C.

(57)　　　　　　　ABSTRACT

An encoding circuit including: a serial-parallel circuit that performs serial-parallel conversion on input data of a uniform sequence to divide the data into a plurality of pieces of divided data; a sequence conversion unit that encodes the divided data and converts the encoded divided data into divided data of a non-uniform sequence; a parallel-serial circuit that converts the divided data and the divided data of the non-uniform sequence converted by the sequence conversion unit into serial data by performing parallel-serial conversion; an external encoding unit that adds an error correction code to the serial data and encodes the serial data; a division unit that divides the serial data to which the error correction code is added into a plurality of pieces of divided data; a bit conversion circuit that regards the plurality of pieces of divided data divided as data to be transmitted in different subchannels and converts a bit sequence to make a communication channel capacity of each subchannel nonuniform; and a conversion unit that allocates data of a (Continued)

uniform sequence to a least significant bit and allocates data of a non-uniform sequence to a most significant bit among the plurality of pieces of divided data.

7 Claims, 12 Drawing Sheets

(58) Field of Classification Search
USPC .......................................................... 341/100
See application file for complete search history.

(56) References Cited

U.S. PATENT DOCUMENTS

| | | | |
|---|---|---|---|
| 2011/0206158 A1 | 8/2011 | Kim et al. | |
| 2017/0099173 A1 | 4/2017 | Yun et al. | |
| 2020/0127680 A1 | 4/2020 | Kim | |
| 2021/0218496 A1 | 7/2021 | Koganei et al. | |

FOREIGN PATENT DOCUMENTS

| | | | | |
|---|---|---|---|---|
| CN | 111200481 A | 5/2020 | | |
| EP | 2843662 A1 | 3/2015 | | |
| JP | 2018-520617 A | 7/2018 | | |
| JP | 2021-111864 A | 8/2021 | | |
| KR | 0133508 B1 * | 4/1998 | ............. | G11B 20/18 |
| WO | WO-2008/087598 A2 | 7/2008 | | |
| WO | WO-2017/057206 A1 | 4/2017 | | |

OTHER PUBLICATIONS

Tsuyoshi Yoshida et al., Multilevel Coding with Flexible Probabilistic Shaping for Rate-Adaptive and Low-Power Optical Communications, OFC 2020, 2020, pp. 1-3.
Kiichi Sugitani et al., Performance Evaluation of WDM Channel Transmission for Probabilistic Shaping With Partial Multilevel Coding, Journal of Lightwave Technology, vol. 39, No. 9, May 1, 2021, pp. 2873-2879.
Takeshi Kakizaki et al., Low-complexity Channel Polarized Multilevel Coding for Modulation-format-independent Forward Error Correction, ECOC2021, (2021).
Bipin Sankar Gopalakrishna Pillai et al., End-to-End Energy Modeling and Analysis of Long-Haul Coherent Transmission Systems, Journal of Lightwave Technology, vol. 32, No. 18, Sep. 15, 2014.
OIF-FEC-100G-01.0, 100G Forward Error Correction White Paper (May 2010), Optical Internetworking Forum.
F. Gabry et al., Multi-Kernel Construction of Polar Codes, 2017 IEEE International Conference on Communications Workshops (ICC Workshops), pp. 761-765 (2017).
H. Lin et al., Linear and Nonlinear Binary Kernels of Polar Codes of Small Dimensions With Maximum Exponents, IEEE Transactions on Information Theory, 61(10), 5253, (2015).
I. Tal et al., List Decoding of Polar Codes, IEEE Transactions on Information Theory, 61(5) 2213, (2015).
"Giuseppe Caire et al., Bit-Interleaved Coded Modulation, IEEE Transactions on Information Theory, vol. 44, No. 3, May 1998, pp. 927-946".
"Hideki Imai et al., A New Multilevel Coding Method Using Error-Correcting Codes, IEEE Transactions on Information Theory, vol. IT-23, No. 3, 1977, pp. 371-377".
"Takeshi Kakizaki et al., Low-complexity Channel-polarized Multilevel Coding for Probabilistic Amplitude Shaping, OFC2022, (2022)".
"Akira Yamada et al., A Study on Quantization for BP Decoding of Polar Codes, IEICE Technical Report, Mar. 2020, vol. 119, No. 448, pp. 263-268".
"Andreas Bisplinghoff et al., Low-Power, Phase-Slip Tolerant, Multilevel Coding for M-QAM, Journal of Lightwave Technology, vol. 35, No. 4, Feb. 15, 2017, pp. 1006-1014".
"Masoud Barakatain et al., Performance-Complexity Tradeoffs of Concatenated FEC for Higher-Order Modulation, Journal of Lightwave Technology, vol. 38, No. 11, Jun. 1, 2020, pp. 2944-2953".
"Yohei Koganei et al., Multilevel Coding With Spatially Coupled Repeat-Accumulate Codes for High-Order QAM Optical Transmission, Journal of Lightwave Technology, vol. 37, No. 2, Jan. 15, 2019, pp. 486-492".
International Search Report from related application No. PCT/JP2022/020454, dated Aug. 23, 2022.

* cited by examiner

| SYMBOL | BIT |
|--------|-----|
| 7 | 010 |
| 5 | 011 |
| 3 | 001 |
| 1 | 000 |
| −1 | 100 |
| −3 | 101 |
| −5 | 111 |
| −7 | 110 |

FIG. 7

ENCODING CIRCUIT, DECODING CIRCUIT, ENCODING METHOD, DECODING METHOD, AND COMPUTER PROGRAM

CROSS-REFERENCE TO RELATED APPLICATIONS

This application is a 371 U.S. National Phase of International Application No. PCT/JP2021/045139 filed on Dec. 8, 2021. The entire disclosure of the above application is incorporated herein by reference.

TECHNICAL FIELD

The present invention relates to an encoding circuit, a decoding circuit, an encoding method, a decoding method, and a computer program.

BACKGROUND ART

With an increase in Internet traffic, a large capacity of optical transmission is required. Therefore, in forward error correction (FEC) in a coherent digital signal processor (DSP) used in an optical transmission network, a technique for improving frequency utilization efficiency and reducing power consumption of a device has been studied. Conventionally, probabilistic constellation shaping (PCS) that optimizes a probability distribution shape of a transmission symbol according to a communication channel in order to increase frequency utilization efficiency, and multilevel coding (MLC) that efficiently reduces soft-decision FEC (SD-FEC) having high performance but a large calculation amount in order to achieve low calculation amount have been proposed. Here, in a case where the PCS is used, probabilistic amplitude shaping (PAS) that simultaneously achieves both the PCS and the FEC is generally used (see, for example, Non Patent Literature 1).

Further, a technique combining the PCS technique and the MLC technique (PCS+MLC) has also been studied (see, for example, Non Patent Literatures 2 and 3). However, in the conventional MLC technique, a symbol mapper is used to make the communication channel capacity between bit levels non-uniform, and the bit-level SD-FEC having a large communication channel capacity is reduced for low calculation amount, and therefore, the calculation amount that can be reduced is limited at a low modulation multilevel degree (for example, 16 quadrature amplitude modulation (QAM) or the like). Therefore, a similar problem occurs in a technique in which the PCS technique and the MLC technique are combined.

Thus, as a technique similar to the MLC, channel-polarized multilevel coding (CP-MLC) has been proposed (see, for example, Non Patent Literature 4). In the CP-MLC, due to a phenomenon called communication channel polarization, the communication channel is divided into a subchannel with high reliability (a subchannel with large communication channel capacity) and a subchannel with low reliability (a subchannel with small communication channel capacity) and is made non-uniform, and the SD-FEC is applied only to the subchannel with a small communication channel capacity, so that the FEC calculation amount can be reduced without depending on the modulation method in a binary code framework.

CITATION LIST

Non Patent Literature

Non Patent Literature 1: G. Bocherer et al., "Bandwidth Efficient and Rate-Matched Low-Density Parity-Check Coded Modulation", IEEE Trans Commun., vol. 63, no. 12, pp4651-4655(2015).

Non Patent Literature 2: T. Yoshida, M. Karlsson and E. Agrell, "Multilevel Coding with Flexible Probabilistic Shaping for Rate-Adaptive and Low-Power Optical Communications", 2020 Optical Fiber Communications Conference and Exhibition (OFC), 2020, pp. 1-3.

Non Patent Literature 3: K. Sugitani, Y. Koganei, H. Irie and H. Nakashima, "Performance Evaluation of WDM Channel Transmission for Probabilistic Shaping With Partial Multilevel Coding", in Journal of Lightwave Technology, vol. 39, no. 9, pp. 2873-2879, 1 May 1, 2021, doi: 10.1109/JLT.2021.3061177.

Non Patent Literature 4: T. Kakizaki et al., "Low-complexity Channel Polarized Multilevel Coding for Modulation-format-independent Forward Error Correction", ECOC2021, (2021)

SUMMARY OF INVENTION

Technical Problem

If the configuration of the CP-MLC can be applied to the PAS, it is possible to achieve high frequency utilization efficiency and the configuration of reducing the FEC calculation amount regardless of the modulation multilevel degree. However, when the configuration of the CP-MLC is applied to the PAS, there is a problem that the CP-MLC cannot be applied to the PAS depending on the modulation multilevel degree or the configuration because the CP-MLC is not a systematic code.

In view of the above circumstances, an object of the present invention is to provide a technique capable of high frequency utilization efficiency and reducing the FEC calculation amount regardless of the modulation multilevel degree.

Solution to Problem

An aspect of the present invention is an encoding circuit used for coherent digital signal processing, including: a serial-parallel circuit that performs serial-parallel conversion on input data of a uniform sequence to divide the data into a plurality of pieces of divided data; a sequence conversion unit that encodes the divided data and converts the encoded divided data into divided data of a non-uniform sequence; a parallel-serial circuit that converts the divided data output from the serial-parallel circuit and the divided data of the non-uniform sequence converted by the sequence conversion unit into serial data by performing parallel-serial conversion; an external encoding unit that adds an error correction code to the serial data and encodes the serial data; a division unit that divides the serial data to which the error correction code is added into a plurality of pieces of divided data; a bit conversion circuit that regards the plurality of pieces of divided data divided by the division unit as data to be transmitted in different subchannels and converts a bit sequence to make a communication channel capacity of each subchannel non-uniform; and a conversion unit that allocates data of a uniform sequence to a least significant bit and allocates data of a non-uniform sequence to a most significant bit among the plurality of pieces of divided data output from the bit conversion circuit.

An aspect of the present invention is a decoding circuit used for coherent digital signal processing, including: a serial-parallel circuit that performs serial-parallel conversion on input data to divide the data into a plurality of pieces of divided data; a first likelihood calculation circuit that calculates a likelihood by soft decision on a basis of some pieces of divided data of the plurality of pieces of divided data and information of noise generated in a communication channel; a decoding unit that uses the likelihood as an input and corrects an error of the divided data input to the first likelihood calculation circuit; one or more second likelihood calculation circuits that calculate a likelihood related to a conditional probability on a basis of a code word error-corrected by the decoding unit, some pieces of divided data of the plurality of pieces of divided data, and information of noise generated in the communication channel, and makes a hard decision; a combining unit that combines an obtained bit sequence and a decoded information bit; an outer code decoding unit that decodes an outer code; a serial-parallel circuit that performs serial-parallel conversion on input data to divide the data into divided data of a uniform sequence and divided data of a non-uniform sequence; a sequence conversion unit that decodes the divided data of the non-uniform sequence and converts the divided data into divided data of a uniform sequence; and a parallel-serial circuit that performs parallel-serial conversion on the divided data of the uniform sequence output from the sequence conversion unit and the divided data of the uniform sequence divided to restore the data of the uniform sequence.

An aspect of the present invention is an encoding method used for coherent digital signal processing, including: performing serial-parallel conversion on input data of a uniform sequence to divide the data into a plurality of pieces of divided data; encoding the divided data and converting the encoded divided data into divided data of a non-uniform sequence; converting the divided data and the divided data of the non-uniform sequence into serial data by performing parallel-serial conversion; adding an error correction code to the serial data and encoding the serial data; dividing the serial data to which the error correction code is added into a plurality of pieces of divided data; regarding the plurality of pieces of divided data divided as data to be transmitted in different subchannels and converting a bit sequence to make a communication channel capacity of each subchannel non-uniform; and allocating data of a uniform sequence to a least significant bit and allocating data of a non-uniform sequence to a most significant bit among the plurality of pieces of divided data.

An aspect of the present invention is a decoding method used for coherent digital signal processing, including: performing serial-parallel conversion on input data to divide the data into a plurality of pieces of divided data; calculating a likelihood by soft decision on a basis of some pieces of divided data of the plurality of pieces of divided data and information of noise generated in a communication channel; using the likelihood as an input and correcting an error of the divided data; calculating a likelihood related to a conditional probability on a basis of a code word error-corrected, some pieces of divided data of the plurality of pieces of divided data, and information of noise generated in the communication channel, and making a hard decision; combining an obtained bit sequence and a decoded information bit; decoding an outer code; performing serial-parallel conversion on input data to divide the data into divided data of a uniform sequence and divided data of a non-uniform sequence; decoding the divided data of the non-uniform sequence and converting the divided data into divided data of a uniform sequence; and performing parallel-serial conversion on the divided data of the uniform sequence converted and the divided data of the uniform sequence divided to restore the data of the uniform sequence.

An aspect of the present invention is a computer program for causing a computer to execute processing of: performing serial-parallel conversion on input data of a uniform sequence to divide the data into a plurality of pieces of divided data; encoding the divided data and converting the encoded divided data into divided data of a non-uniform sequence; converting the divided data and the divided data of the non-uniform sequence into serial data by performing parallel-serial conversion; adding an error correction code to the serial data and encoding the serial data; dividing the serial data to which the error correction code is added into a plurality of pieces of divided data; regarding the plurality of pieces of divided data divided as data to be transmitted in different subchannels and converting a bit sequence to make a communication channel capacity of each subchannel non-uniform; and allocating data of a uniform sequence to a least significant bit and allocating data of a non-uniform sequence to a most significant bit among the plurality of pieces of divided data.

An aspect of the present invention is a computer program for causing a computer to execute processing of: performing serial-parallel conversion on input data to divide the data into a plurality of pieces of divided data; calculating a likelihood by soft decision on a basis of some pieces of divided data of the plurality of pieces of divided data and information of noise generated in a communication channel; using the likelihood as an input and correcting an error of the divided data; calculating a likelihood related to a conditional probability on a basis of a code word error-corrected, some pieces of divided data of the plurality of pieces of divided data, and information of noise generated in the communication channel, and making a hard decision; combining an obtained bit sequence and a decoded information bit; decoding an outer code; performing serial-parallel conversion on input data to divide the data into divided data of a uniform sequence and divided data of a non-uniform sequence; decoding the divided data of the non-uniform sequence and converting the divided data into divided data of a uniform sequence; and performing parallel-serial conversion on the divided data of the uniform sequence converted and the divided data of the uniform sequence divided to restore the data of the uniform sequence.

Advantageous Effects of Invention

According to the present invention, it is possible to achieve high frequency utilization efficiency and reduce the FEC calculation amount regardless of the modulation multilevel degree.

BRIEF DESCRIPTION OF DRAWINGS

FIG. 7 is a diagram illustrating an example of allocation by a symbol mapper.

DESCRIPTION OF EMBODIMENTS

Hereinafter, an embodiment of the present invention will be described with reference to the drawings.

First Embodiment

Figure 1:
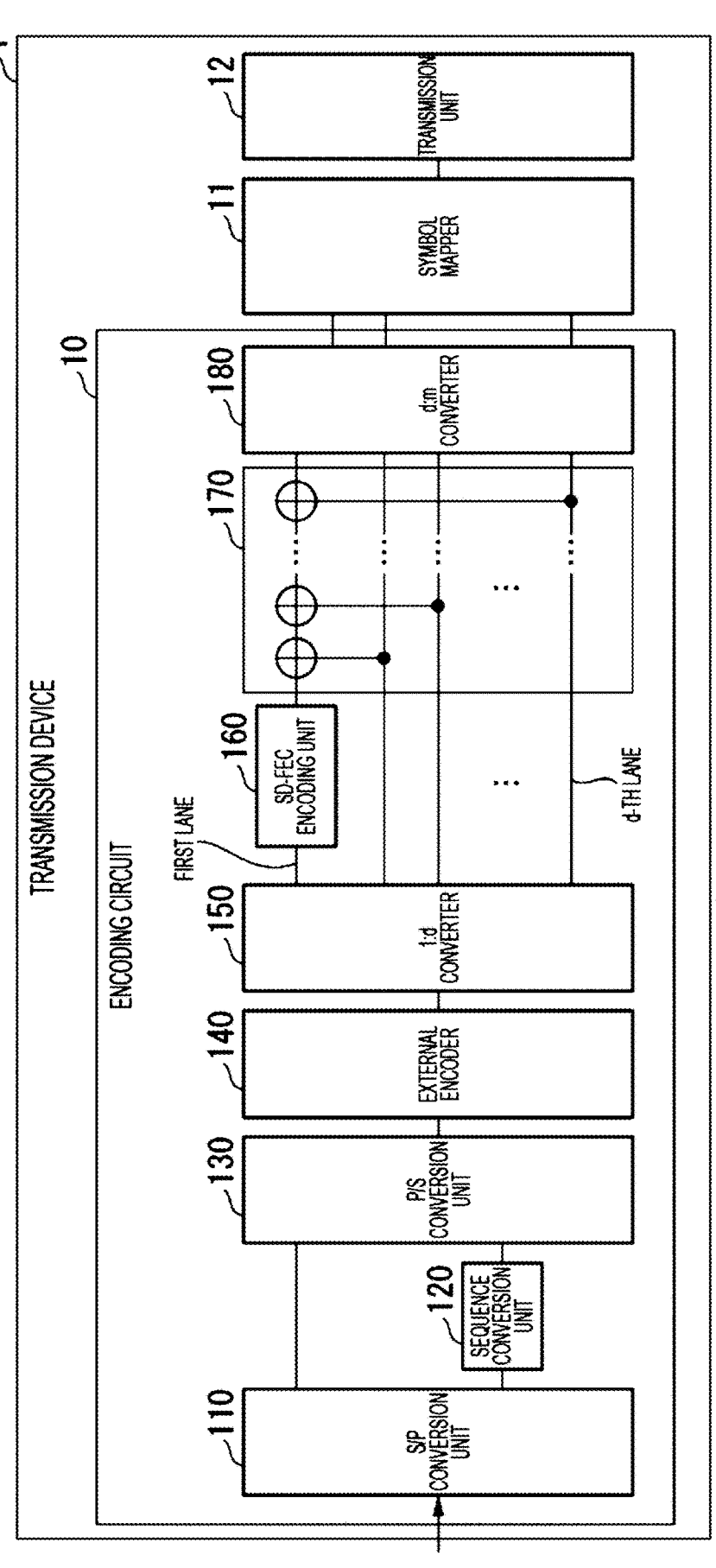
FIG. 1 is a block diagram illustrating a configuration example of a transmission device of a first embodiment.

FIG. 1 is a block diagram illustrating a configuration example of a transmission device 1 of the first embodiment. The transmission device 1 is a part of a digital coherent communication system, and is a transmission device used for transmission of data to be transmitted (hereinafter referred to as "transmission data"). The transmission device 1 transmits the transmission data to a reception device connected via a communication channel. For example, the communication channel is assumed to be an additive white Gaussian noise (AWGN) communication channel.

The transmission device 1 includes an encoding circuit 10, a symbol mapper 11, and a transmission unit 12. The encoding circuit 10 includes an S/P conversion unit 110, a sequence conversion unit (sequence converter) 120, a P/S conversion unit (divider) 130, an external encoder 140 (external encoder), a 1:d converter 150, an SD-FEC encoding unit 160, a bit conversion circuit 170, and a dim converter 180 (converter).

The S/P conversion unit 110 divides transmission target data into a plurality of pieces of data by performing serial-parallel conversion on the input transmission target data. For example, the S/P conversion unit 110 divides the transmission target data into two pieces of data. The transmission target data is data of a uniform sequence. Here, the uniform sequence indicates an information sequence in which an information sequence (for example, bits) is generated according to a uniform distribution.

The sequence conversion unit 120 converts the uniform sequence into a non-uniform sequence. Specifically, the sequence conversion unit 120 is a converter that reversibly converts a uniform bit sequence having a certain length k (k is an integer of 1 or more) into a non-uniform symbol sequence having a length n (n is an integer of 1 or more). Note that $k \leq n \times (m-1)$, and redundancy $n-k$ is determined according to the shape of the non-uniform distribution. m is a bit length per symbol (bit/symbol). Here, the non-uniform sequence indicates an information sequence that is not a uniform sequence. In the first embodiment, $d \geq m$. d indicates the number of lanes in the 1:d converter 150.

The P/S conversion unit 130 converts the data of the uniform sequence output from the S/P conversion unit 110 and the data of the non-uniform sequence converted by the sequence conversion unit 120 into serial data by performing parallel-serial conversion.

The external encoder 140 simultaneously corrects an error that cannot be corrected in the SD-FEC and all the remaining errors. The external encoder 140 is an aspect of an external encoding unit.

The 1:d converter 150 divides the output from the external encoder 140 into d (d is an integer of 2 or more) lanes, allocates a part of the data of the uniform sequence to the first lane, and allocates the remaining uniform sequence and amplitude sequence to the second to d-th lanes. Note that the 1:d converter 150 may perform interleaving to prevent burst errors caused by inner codes as necessary.

The SD-FEC encoding unit 160 performs encoding using an error correction code.

The bit conversion circuit 170 is a conversion circuit in which a proportion at which an input is output as it is with respect to the number of bits d per symbol is (d−1)/d or less. By combining with a receiver, errors are concentrated on the bits of the first lane, and errors of the bits of the second to d-th lanes are virtually reduced.

The d:m converter 180 converts data of a sequence transmitted in each of the first to d-th lanes into data of a sequence of m lanes.

Similarly to the conventional PAS, the symbol mapper 11 generates transmission data by allocating bits of uniform distribution to least significant bits (LSBs) corresponding to positive and negative of a symbol and allocating non-uniform distribution to most significant bits (MSBs) corresponding to amplitude.

The transmission unit 12 transmits the transmission data generated by the symbol mapper 11.

Figure 2:
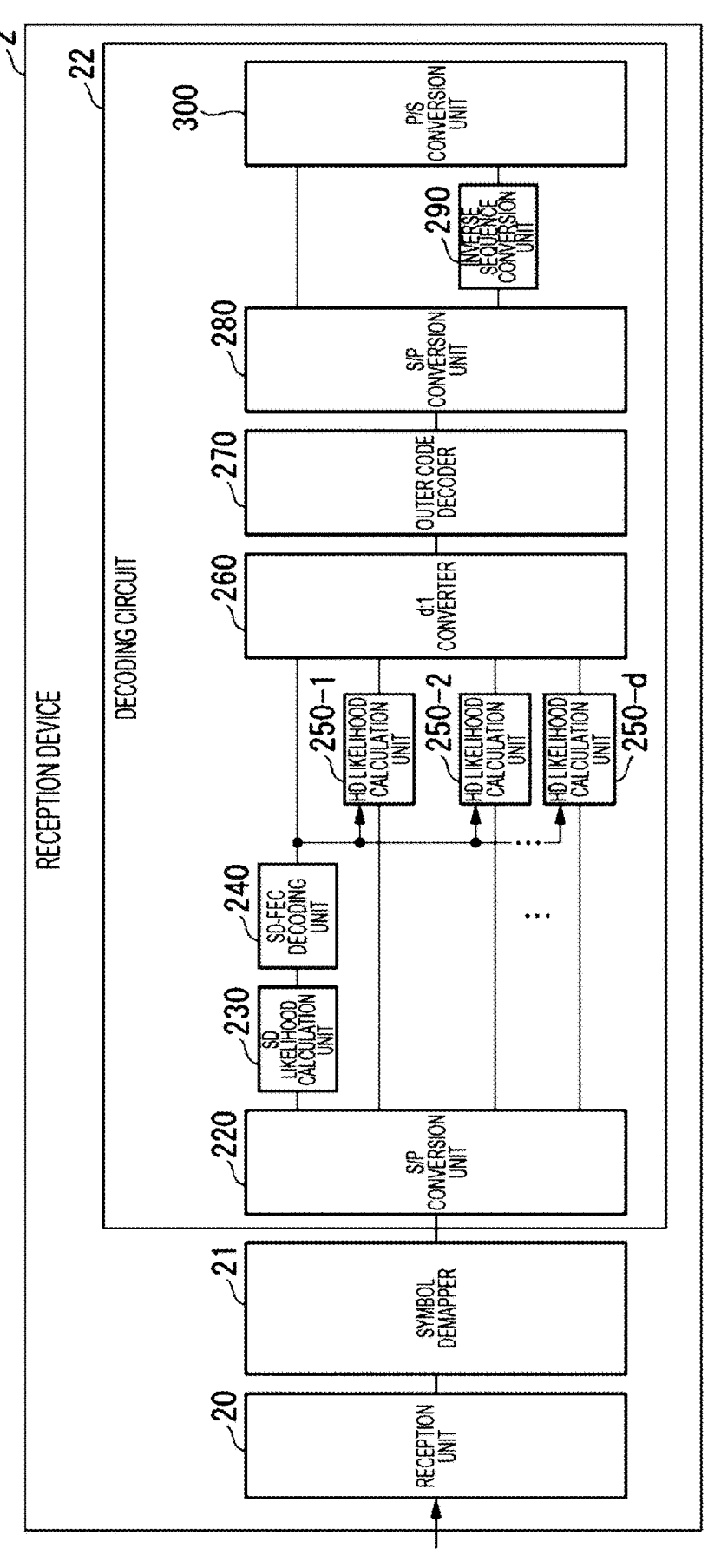
FIG. 2 is a block diagram illustrating a configuration example of a reception device of the first embodiment.

FIG. 2 is a block diagram illustrating a configuration example of a reception device 2 of the first embodiment. The reception device 2 is a reception device used in a digital coherent communication system. The reception device 2 receives the transmission data transmitted from the transmission device 1 connected via the communication channel.

The reception device 2 includes a reception unit 20, a symbol demapper 21, and a decoding circuit 22.

The reception unit 20 receives the transmission data transmitted from the transmission device 1 via the communication channel.

The symbol demapper 21 demodulates the transmission data received by the reception unit 20 in a demodulation method corresponding to a modulation method.

The decoding circuit 22 includes an S/P conversion unit 220, an SD likelihood calculation unit 230, an SD-FEC decoding unit (decoder) 240, a plurality of HD likelihood calculation units 250-1 to 250-*d*, a d:1 converter (combiner) 260, an outer code decoder 270, an S/P conversion unit 280, an inverse sequence conversion unit (sequence converter) 290, and a P/S conversion unit 300.

The S/P conversion unit 220 divides the transmission data into a plurality of pieces of data by performing serial-parallel conversion on the transmission data demodulated by the symbol demapper 21. For example, the S/P conversion unit 220 divides the transmission data into the number d according to the number of lanes.

The SD likelihood calculation unit 230 calculates the likelihood on the basis of the data output from the S/P conversion unit 220 and communication channel information. The communication channel information indicates a distribution of noise in the communication channel. The communication channel information can be measured by a spectrum analyzer or the like. It is assumed that the communication channel information is measured in advance and stored in the SD likelihood calculation unit 230.

The processing of the SD likelihood calculation unit 230 will be described more specifically. The SD likelihood calculation unit 230 is a circuit that obtains a probability likelihood $L^{(1)}$ related to a probability $P(y|z^{(1)})$ input to the SD-FEC decoding unit 240 in order to estimate a code word $z^{(1)}$ output from the SD-FEC encoding unit 160 from a received word y and communication channel information $P(y|x)$. For example, in a case where the communication channel $P(y|z^{(1)})$ is independent in each symbol as $y = [y_1 y_2 \cdots y_{n'}]$, the SD likelihood calculation unit 230 calculates a likelihood $L_i^{(1)}$ on the basis of Formula 1 described below.

[Math. 1]

$$L_i^{(1)} = \log \frac{P_{Z_i^{(1)}}(0)}{P_{Z_i^{(1)}}(1)} + \log \frac{P_{Y_i|Z_i^{(1)}}(y_i \mid 0)}{P_{Y_i|Z_i^{(1)}}(y_i \mid 1)} \quad (1)$$

$$P_{Y_i|Z_i^{(1)}}(y_i \mid z_i^{(1)}) = \sum_{Z_i^{(j)}:j=2,3,\ldots,d} P_{Y_i,Z_i^{(2)},Z_i^{(3)},\ldots,Z_i^{(d)}|Z_i^{(1)}}$$

$$\left(Y_i, z_i^{(2)}, z_i^{(3)}, \ldots, z_i^{(d)} \mid z_i^{(1)}\right)$$

$$= \sum_{Z_i^{(j)}:j=2,3,\ldots,d} P_{Y_i|Z_i^{(1)},Z_i^{(2)},Z_i^{(3)},\ldots,Z_i^{(d)}}$$

$$\left(Y_i \mid z_i^{(1)}, z_i^{(2)}, z_i^{(3)}, \ldots, z_i^{(d)}\right)$$

$$P_{Z_i^{(2)},Z_i^{(3)},\ldots,Z_i^{(d)}}\left(z_i^{(2)}, z_i^{(3)}, \ldots, z_i^{(d)}\right)$$

$$= \sum_{Z_i^{(j)}:j=2,3,\ldots,d} P_{Y_i|X_i^{(1)}}$$

$$\left(Y_i \mid z_i^{(1)} \oplus z_i^{(2)} \oplus z_i^{(3)} \oplus \ldots \oplus z_i^{(d)}\right)$$

$$\prod_{Z_i^{(j)}:j=2,3,\ldots,d} P_{Y_i|X_i^{(j)}}$$

$$\left(Y_i \mid z_i^{(j)}\right) P_{X_i^{(j)}}\left(z_i^{(j)}\right)$$

Here, $n'=n/d$, which is an integer. Here, it is assumed that the code length and the number of divisions are designed such that n' is an integer. Further, $y_i = [y_i^{(1)} y_i^{(2)} \cdots y_i^{(d)}]$.

The SD-FEC decoding unit 240 performs error correction decoding using the likelihood $L_i^{(1)}$ calculated by the SD likelihood calculation unit 230, and acquires the code word $z^{(1)}$ in which the error is corrected.

The plurality of HD likelihood calculation units 250-1 to 250-d calculates the likelihood related to a conditional probability $P(y,z^{(1)}|z^{(s)})$ on the basis of the corrected code word $z^{(1)}$, the received word y, and the communication channel information $P(y|x)$. For example, similarly to the SD likelihood calculation unit 230, in a case where the communication channel $P(y|z^{(1)})$ is independent by each suffix such as $y = [y_1 y_2 \cdots y_{n'}]$, each HD likelihood calculation unit 250 makes a hard decision on the basis of Formula 2 described below and calculates a bit z(s). Note that s is an integer of 2 or more and d or less.

[Math. 2]

$$L_i^{(s)} = \log \frac{P_{Z_i^{(s)}}(0)}{P_{Z_i^{(s)}}(1)} + \log \frac{P_{Y_i,Z_i^{(1)}|Z_i^{(s)}}(y_i, Z_i^{(1)} \mid 0)}{P_{Y_i,Z_i^{(1)}|Z_i^{(s)}}(y_i, Z_i^{(1)} \mid 1)} \quad (2)$$

-continued $$\text{NOTE THAT } Z_i^{(s)} = \begin{cases} 0 & (L_i^{(s)} \geq 0) \\ 1 & (L_i^{(s)} < 0) \end{cases}$$

$$P_{Y_i,Z_i^{(1)}|Z_i^{(s)}}(y_i, z_i^{(1)} \mid z_i^{(s)}) = \sum_{Z_i^{(j)}:j=2,3,\ldots,s-1,s+1,\ldots,d}$$

$$P_{Y_i,Z_i^{(1)},Z_i^{(2)},\ldots,Z_i^{(s-1)},Z_i^{(s+1)},\ldots,Z_i^{(d)}|Z_i^{(s)}}$$

$$\left(Y_i, z_i^{(1)}, z_i^{(2)}, \ldots, z_i^{(s-1)}, z_i^{(s+1)}, z_i^{(d)} \mid z_i^{(s)}\right)$$

$$= \sum_{Z_i^{(j)}:j=2,3,\ldots,s-1,s+1,\ldots,d} P_{Y_i|Z_i^{(1)},Z_i^{(2)},\ldots,Z_i^{(d)}}$$

$$\left(Y_i \mid z_i^{(1)}, z_i^{(2)}, \ldots, z_i^{(d)}\right)$$

$$= P_{Z_i^{(1)},Z_i^{(2)},\ldots,Z_i^{(s-1)},Z_i^{(s+1)},\ldots,Z_i^{(d)}}$$

$$\left(z_i^{(1)}, z_i^{(2)}, \ldots, z_i^{(s-1)}, z_i^{(s+1)}, \ldots, z_i^{(d)}\right)$$

$$= \sum_{Z_i^{(j)}:j=2,3,\ldots,s-1,s+1,\ldots,d} P_{Y_i|X_i^{(1)}}$$

$$\left(Y_i \mid z_i^{(1)} \oplus z_i^{(2)} \oplus z_i^{(3)} \oplus \ldots \oplus z_i^{(d)}\right)$$

$$P_{Z_i^{(1)}}\left(z_i^{(1)}\right) \prod_{Z_i^{(j)}:j=2,3,\ldots,s-1,s+1,\ldots,d} P_{Y_i|X_i^{(j)}}$$

$$\left(Y_i \mid z_i^{(j)}\right) P_{Z_i^{(j)}}\left(z_i^{(j)}\right)$$

The d:1 converter 260 combines an information bit sequence corresponding to the code word $z^{(1)}$ transmitted in one lane and each $z^{(s)}$ into one.

The outer code decoder 270 converts the bit sequence and then decodes the outer code.

The S/P conversion unit 280 divides the data into a plurality of pieces of data by performing serial-parallel conversion on the input data. For example, the S/P conversion unit 280 divides the data into two pieces of data. The S/P conversion unit 280 outputs the data of the non-uniform sequence to the inverse sequence conversion unit 290, and outputs the data of the uniform sequence to the P/S conversion unit 300.

The inverse sequence conversion unit 290 converts a non-uniform sequence into a uniform sequence. Specifically, the inverse sequence conversion unit 290 is a converter that reversibly converts a non-uniform symbol sequence having a length n into a uniform bit sequence having a length k. As a result, the original uniform sequence is restored.

The P/S conversion unit 300 converts the data of the uniform sequence output from the S/P conversion unit 280 and the data of the uniform sequence converted by the inverse sequence conversion unit 290 into serial data by performing parallel-serial conversion. As a result, the transmission data can be decoded.

Figure 3:
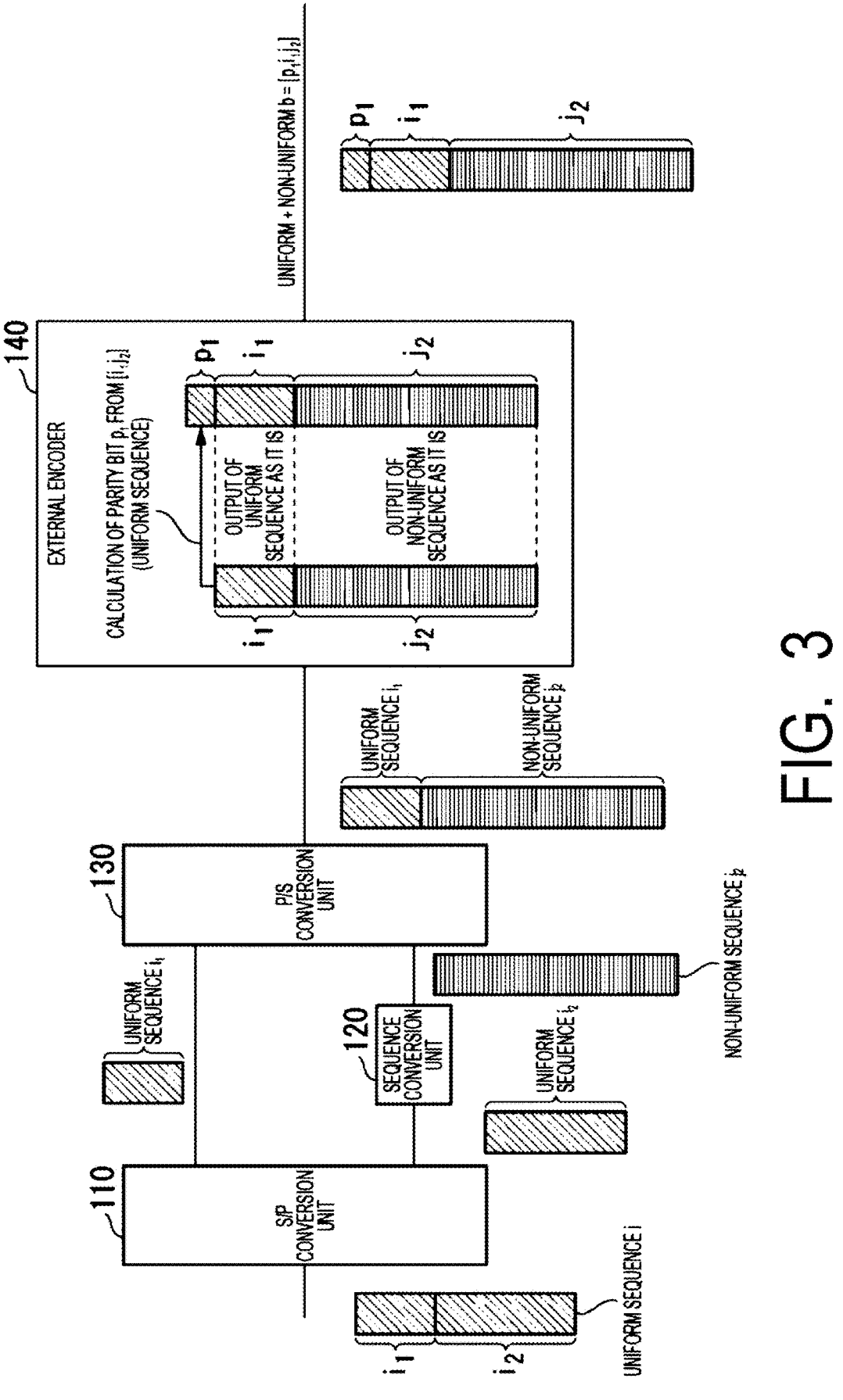
FIG. 3 is a diagram for describing details of processing performed by an S/P conversion unit, a sequence conversion unit, a P/S conversion unit, and an external encoder included in the transmission device.

Next, processing performed by the transmission device 1 will be described in detail with reference to FIGS. 3 to 6. FIG. 3 is a diagram for describing details of processing performed by the S/P conversion unit 110, the sequence conversion unit 120, the P/S conversion unit 130, and the external encoder 140 included in the transmission device 1. As illustrated in FIG. 3, it is assumed that the transmission target data of a uniform sequence i is input to the S/P conversion unit 110. The S/P conversion unit 110 divides the input transmission target data of the uniform sequence i into a plurality of pieces of data. For example, the S/P conversion unit 110 divides the transmission target data of the uniform sequence i into the transmission target data of a uniform sequence $i_1$ and the transmission target data of a uniform sequence $i_2$. In FIGS. 3 to 6, the transmission target data of the uniform sequence $i_1$ is indicated as the uniform sequence $i_1$, and the transmission target data of the uniform sequence $i_2$ is indicated as the uniform sequence $i_2$.

The S/P conversion unit 110 outputs the transmission target data of the uniform sequence in to the P/S conversion unit 130, and outputs the transmission target data of the uniform sequence $i_2$ to the sequence conversion unit 120. The sequence conversion unit 120 encodes the input transmission target data of the uniform sequence 12 to obtain transmission target data of a non-uniform sequence $j_2$. In this manner, the sequence conversion unit 120 encodes the transmission target data of the uniform sequence $i_2$ within the uniform sequence $i=[i_1 i_2] \in \{0,1\}^k$ to obtain the transmission target data of the non-uniform sequence $j_2$. In FIGS. 3 to 6, the transmission target data of the non-uniform sequence $j_2$ is indicated as the non-uniform sequence $j_2$.

After converting bits into non-uniform symbols, the sequence conversion unit 120 performs conversion to a bit string corresponding to a symbol mapper that makes m-bit and 1-symbol correspond on a one-to-one basis in a lookup table. An input of the sequence conversion unit 120 is a bit sequence, and an output is a bit sequence corresponding to a non-uniform symbol sequence.

The transmission target data of the uniform sequence $i_1$ and the transmission target data of the non-uniform sequence $j_2$ are input to the P/S conversion unit 130. The P/S conversion unit 130 converts each input transmission target data into serial data by performing parallel-serial conversion. As a result, as illustrated in FIG. 3, the transmission target data of the uniform sequence in and the transmission target data of the non-uniform sequence $j_2$ are connected in series. Transmission target data $[i_1 j_2]$ is input to the external encoder 140. Since the outer code is a systematic code, the external encoder 140 calculates a parity bit $p_1$ from the transmission target data $[i_1 j_2]$ and gives the parity bit $p_1$ to the sequence of the transmission target data $[i_1 j_2]$. As a result, the sequence of the entire transmission target data is $b=[p_1 i_1 j_2]$.

Figure 4:
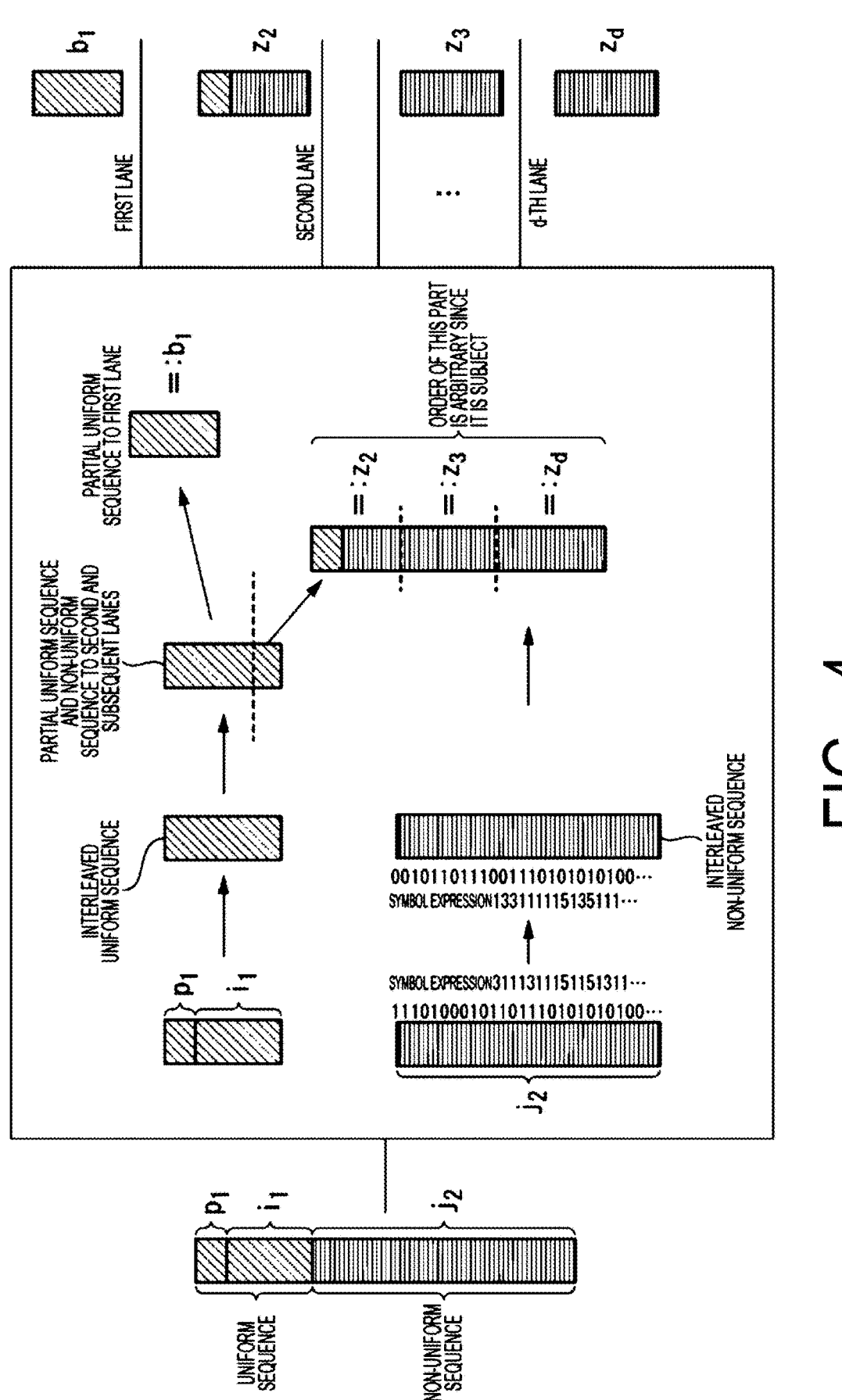
FIG. 4 is a diagram for describing details of processing performed by a 1:d converter included in the transmission device.

FIG. 4 is a diagram for describing details of processing performed by the 1:d converter 150 included in the transmission device 1. As illustrated in FIG. 4, the transmission target data of the sequence $b=[p_1 i_1 j_2]$ is input to the 1:d converter 150. The 1:d converter 150 interleaves and divides the transmission target data of the sequence $b=[p_1 i_1 j_2]$ such that a uniform sequence comes in the first stage. Here, the processing performed by the 1:d converter 150 has three features. The first feature is that the uniform sequence and the non-uniform sequence are separately interleaved. The second feature is that a part of the data of the uniform sequence and the data of the non-uniform sequence are output in the second and subsequent stages. The third feature is that the division length is determined on the basis of each code parameter and the multilevel degree.

In the first feature, the 1:d converter 150 performs interleaving in units of symbols in interleaving of the non-uniform sequence. In the interleaving of the non-uniform sequence, the reason why the interleaving is performed in units of symbols is that the non-uniform sequence has a one-to-one correspondence between m-bit and 1-symbol under the correspondence of the lookup table defined by the symbol mapper. Therefore, it is necessary to perform interleaving at a portion of the non-uniform sequence in units of symbols corresponding to the m-bit. This is because if interleaving is performed in units of bits, the non-uniform sequence collapses.

The 1:d converter 150 interleaves the transmission target data of a uniform sequence $[p_1 i_1]$. The 1:d converter 150 interleaves the transmission target data of the non-uniform sequence $j_2$. Thereafter, the 1:d converter 150 divides the interleaved data of the uniform sequence. The division length is a length determined on the basis of each code parameter and the multilevel degree as described above. The 1:d converter 150 outputs a part (hereinafter, referred to as "data $b_1$") of the divided data of the uniform sequence to the first lane. The 1:d converter 150 gives the rest of the divided data of the uniform sequence to the interleaved data of the non-uniform sequence, and then divides the data. The 1:d converter 150 outputs each divided data $z_2$, $z_3$, and $z_d$ to the second lane, . . . , and the d-th lane. The data $b_1$ output to the first lane is input to the SD-FEC encoding unit 160, and the data $z_2$, $z_3$, and $z_d$ output to the second lane, . . . , and the d-th lane are input to the bit conversion circuit 170.

Figure 5:
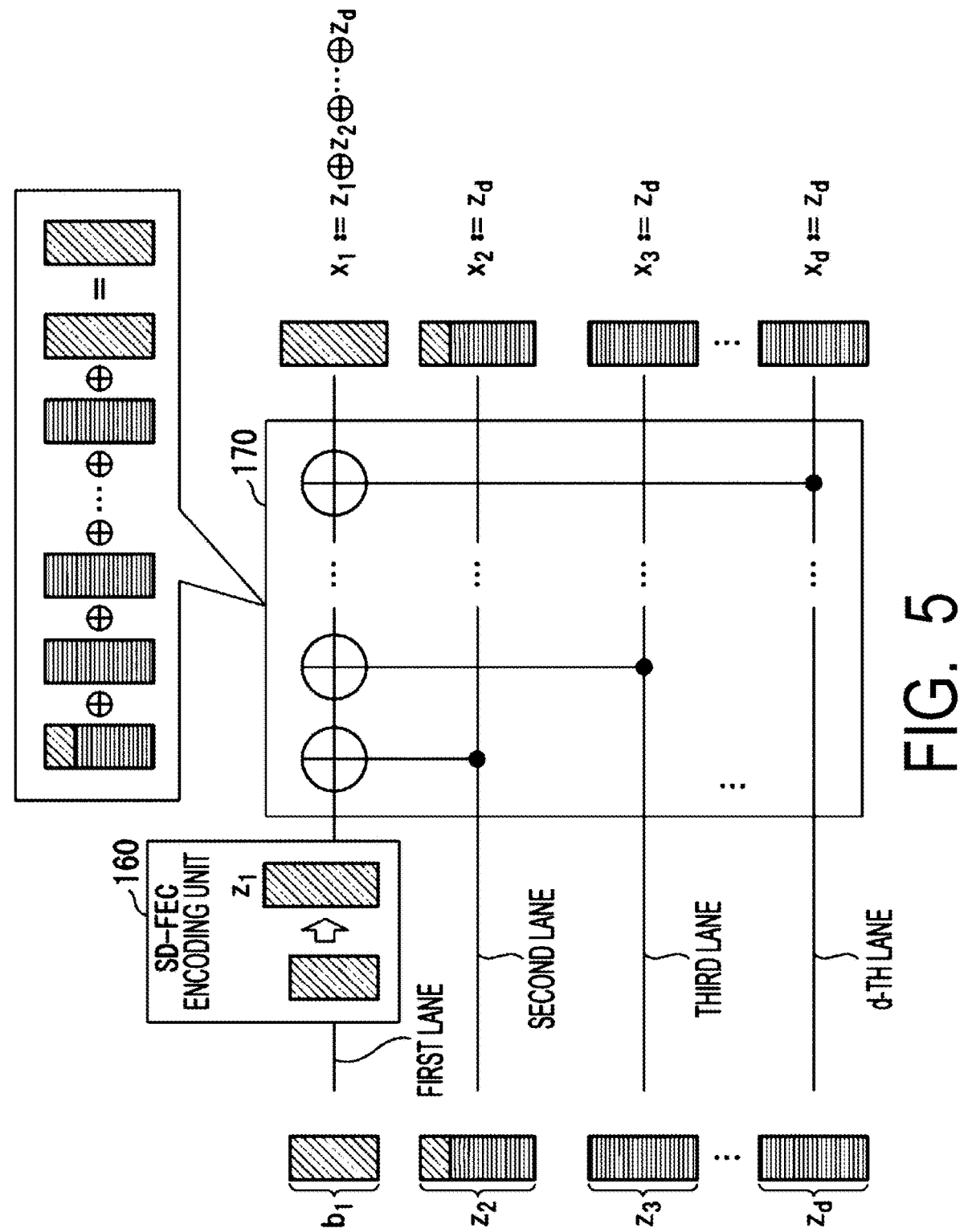
FIG. 5 is a diagram for describing details of processing performed by an SD-FEC encoding unit and a bit conversion circuit included in the transmission device.

FIG. 5 is a diagram for describing details of processing performed by the SD-FEC encoding unit 160 and the bit conversion circuit 170 included in the transmission device 1. As illustrated in FIG. 5, in the first lane for each divided sequence, the SD-FEC encoding unit 160 encodes the data $b_1$ and outputs a sequence $z_1$ to the bit conversion circuit 170. Further, in the first lane, the bit conversion circuit 170 outputs a sequence $x_1$ obtained by exclusive OR of the sequence $z_1$ encoded by the SD-FEC encoding unit 160 and the sequences $z_2$, $z_3$, and $z_d$ output to the second to d-th lanes, and outputs the sequences as they are in the second to d-th lanes. The bit conversion circuit 170 takes an exclusive OR for each element. From the information theoretical property, in a case where there is no correlation, an exclusive OR of a uniform sequence and an arbitrary bit sequence is also a bit sequence according to a uniform distribution, and thus, an output is also a uniform sequence.

Figure 6:
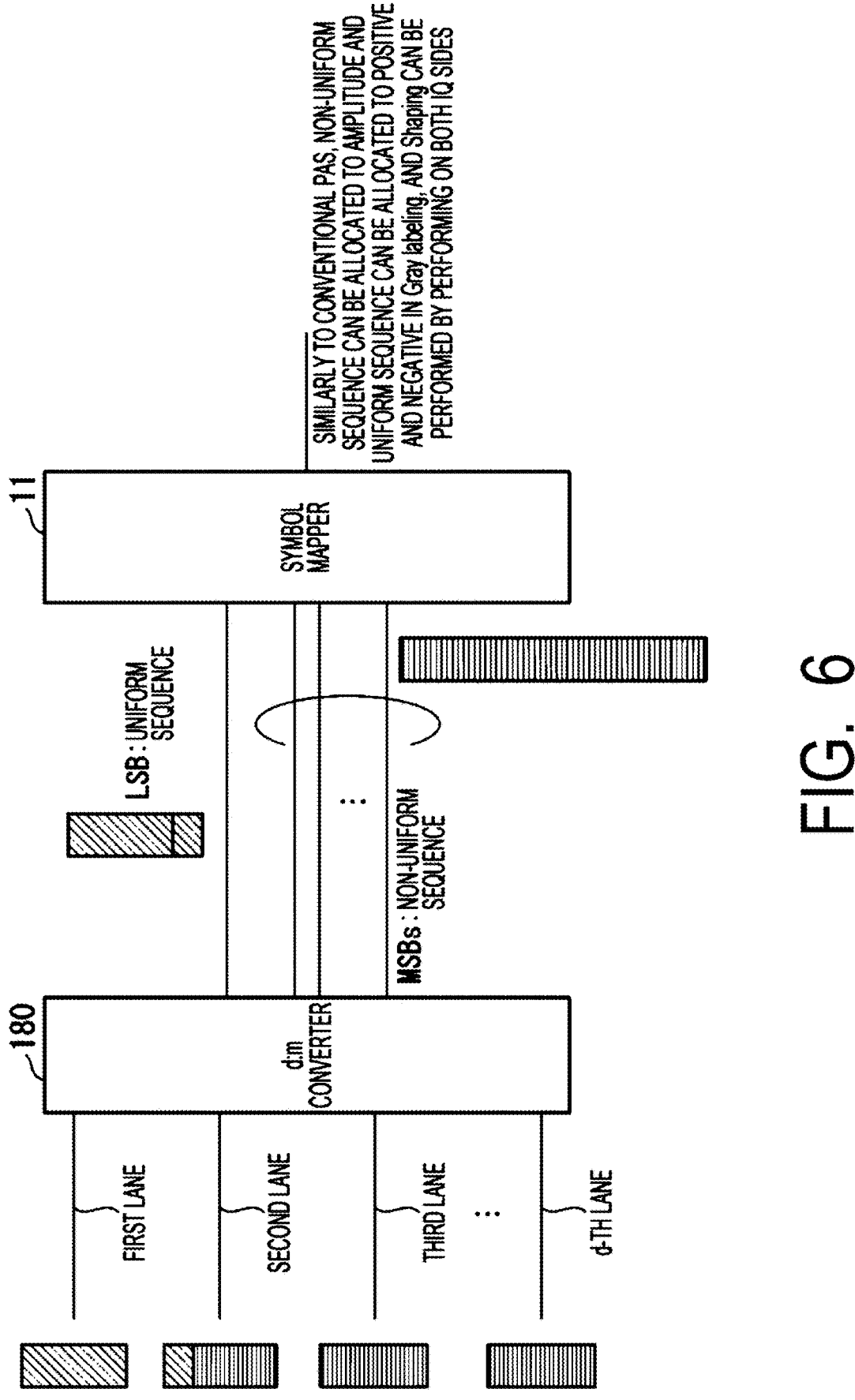
FIG. 6 is a diagram for describing details of processing performed by a d: m converter and a symbol mapper included in the transmission device.

FIG. 6 is a diagram for describing details of processing performed by the d: m converter 180 and the symbol mapper 11 included in the transmission device 1. As illustrated in FIG. 6, the dem converter 180 allocates a uniform sequence to the LSB and a non-uniform sequence to the MSBs. The symbol mapper 11 allocates a uniform sequence to the positive and negative of a symbol and a non-uniform sequence to the amplitude of the symbol. As a result, similarly to the conventional PAS, a non-uniform sequence can be allocated to the amplitude and a uniform sequence can be allocated to the positive and negative in Gray labeling, and Shaping can be performed by performing on both IQ sides.

FIG. 7 is a diagram illustrating an example of allocation by the symbol mapper 11. FIG. 7 illustrates, for example, allocation by the symbol mapper 11 in 64 QAM (one-side 8 PAM). As illustrated in FIG. 7, a uniform sequence is allocated to the LSB (left first bit), and a bit sequence corresponding to the amplitude sequence is allocated to the MSBs (second and third bits).

Next, the input/output length and rate design of each functional unit in the transmission device 1 will be described. It is possible to design the relationship between the coding rate of each element code and an overall coding rate R from the rate of the sequence conversion unit 120 according to those described below. Formula (3) described below indicates a bit length at the time of input/output of each functional unit illustrated in FIG. 1. In Formula (3), n indicates a final bit length of a sequence output from the dem converter 180, and k indicates a bit length of the transmission target data input to the S/P conversion unit 110. Further, $R_{LSB}$, $R_{out}$, and $R_{DM}$ in Formula (3) indicate coding rates of the SD-FEC encoding unit 160, the external encoder 140, and the sequence conversion unit 120, respectively.

Further, in Formula (3), (A1) indicates the bit length of the uniform sequence output from the S/P conversion unit 110 and input to the P/S conversion unit 130, (A2) indicates the bit length of the uniform sequence output from the S/P conversion unit 110 and input to the sequence conversion unit 120, (A3) indicates the bit length of the non-uniform sequence output from the sequence conversion unit 120, (A4) indicates the bit length of the sequence output from the first lane of the 1:d converter 150, (A5) indicates the bit length of the sequence output from the second lane to the d-th lane of the 1:d converter 150, and (A6) indicates the bit length of the sequence subjected to exclusive OR by the bit conversion circuit 170.

[Math. 3]

$$n = \underbrace{\frac{1}{d}n}_{(A6)} + \underbrace{\frac{d-1}{d}n}_{(A5)} = \frac{1}{d}n + \left(\frac{d-1}{d} - \frac{m-1}{m}\right)n + \frac{m-1}{m}n \qquad (3)$$

$$(A\,6) \times R_{LSB} + (A\,5) = (A\,4) + (A\,5) = \frac{1}{d}nR_{LSB} + \left(\frac{d-1}{d} - \frac{m-1}{m}\right)n + \frac{m-1}{m}n$$

$$R_{out}((A4) + (A5)) = (A1) + (A3) = R_{out}\left\{\frac{1}{d}nR_{LSB} + \left(\frac{d-1}{d} - \frac{m-1}{m}\right)n + \frac{m-1}{m}n\right\}$$

$$= \underbrace{\frac{1}{d}nR_{LSB} + \left(\frac{d-1}{d} - \frac{m-1}{m}\right)n - (1 - R_{out})\left(\frac{1}{d}nR_{LSB} + \left(\frac{d-1}{d} - \frac{m-1}{m}\right)n + \frac{m-1}{m}n\right)}_{(A1) : UNIFORM\ SEQUENCE} \quad \underbrace{+ \frac{m-1}{m}n}_{(A3) : NON\text{-}UNIFORM\ SEQUENCE}$$

$$(A1) + R_{DM} \times (A3) = (A1) + (A2) = k$$

$$= \frac{1}{d}nR_{LSB} + \left(\frac{d-1}{d} - \frac{m-1}{m}\right)n - (1 - R_{out})\left(\frac{1}{d}nR_{LSB} + \left(\frac{d-1}{d} - \frac{m-1}{m}\right)n + \frac{m-1}{m}n\right) + R_{DM}\frac{m-1}{m}n$$

$$= R_{out}\left(\frac{1}{d}nR_{LSB} + \left(\frac{d-1}{d} - \frac{m-1}{m}\right)n\right) - (1 - R_{out})\frac{m-1}{m}n + R_{DM}\frac{m-1}{m}n$$

$$= n\left\{R_{out}\left(\frac{R_{LSB} + d - 1}{d}\right) + \frac{(m-1)(R_{DM} - 1)}{m}\right\}$$

Further, a relationship (theoretical value) between the coding rate of each element code and the overall coding rate R is indicated by Formula (4) described below.

[Math. 4]

$$R = R_{out}\left(\frac{R_{LSB} + d - 1}{d}\right) + \frac{(m-1)(R_{DM} - 1)}{m} \qquad (4)$$

Figure 8:
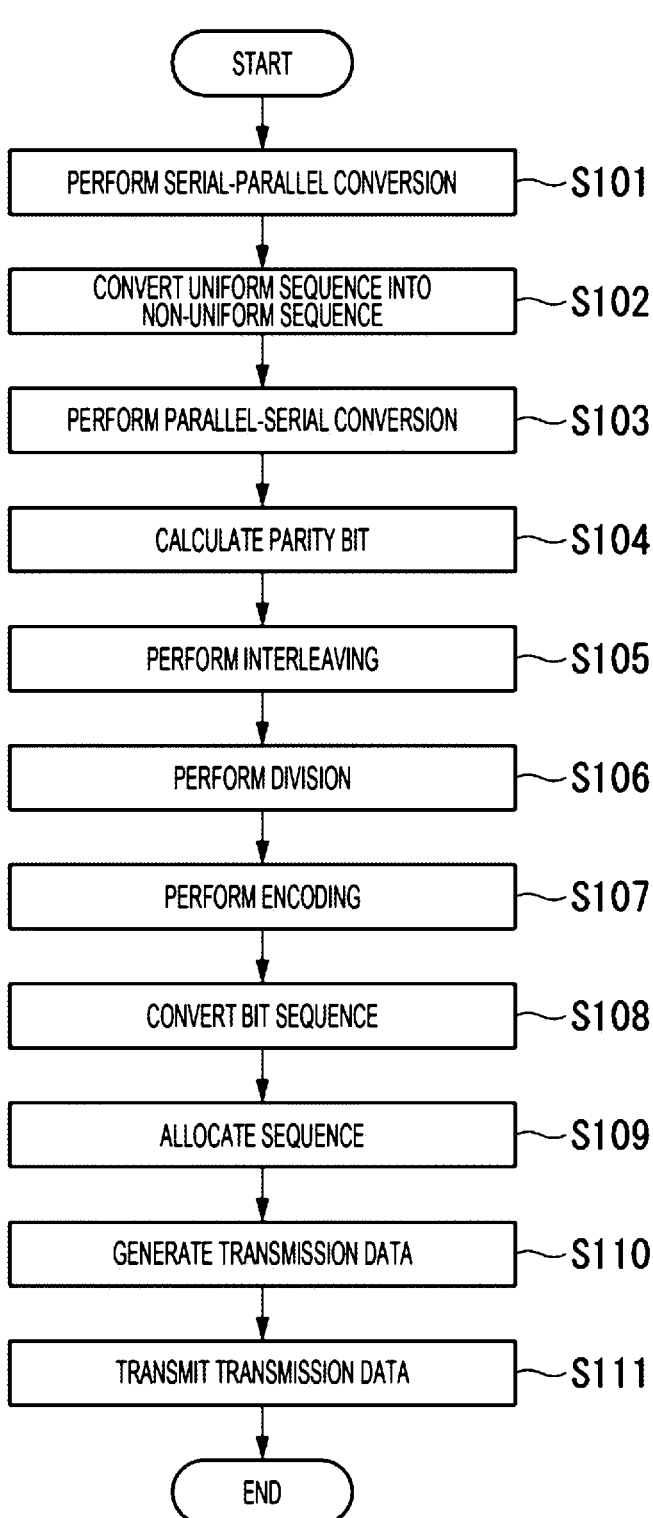
FIG. 8 is a flowchart illustrating a flow of processing of the transmission device of the first embodiment.

FIG. 8 is a flowchart illustrating a flow of processing of the transmission device 1 of the first embodiment.

The S/P conversion unit 110 performs serial-parallel conversion on the transmission target data (step S101). For example, the S/P conversion unit 110 divides the transmission target data into two pieces of data.

The S/P conversion unit 110 outputs one piece of divided data to the P/S conversion unit 130 and outputs the remaining data to the sequence conversion unit 120. The sequence conversion unit 120 converts the data of the uniform sequence into the data of the non-uniform sequence by encoding the input data (step S102). The sequence conversion unit 120 outputs the data of the non-uniform sequence to the P/S conversion unit 130.

The P/S conversion unit 130 converts the data output from the S/P conversion unit 110 and the data of the non-uniform sequence output from the sequence conversion unit 120 into serial data by performing parallel-serial conversion (step S103). Specifically, the P/S conversion unit 130 combines the data output from the S/P conversion unit 110 and the data of the non-uniform sequence output from the sequence conversion unit 120 and converts the combined data into the serial data. The P/S conversion unit 130 outputs the converted data to the external encoder 140.

The external encoder 140 calculates a parity bit using the data of the uniform sequence and the data of the non-uniform sequence (step S104). The external encoder 140 gives the calculated parity bit to the serial data and outputs the data to the 1:d converter 150. The 1:d converter 150 interleaves the data output from the external encoder 140 (step S105). Here, the 1:d converter 150 separately interleaves the data of the uniform sequence and the data of the non-uniform sequence. Thereafter, the 1:d converter 150 divides each interleaved data (step S106).

Specifically, first, the 1:d converter 150 divides the interleaved data of the uniform sequence into a predetermined code length as described with reference to FIG. 4. The 1:d converter 150 outputs the divided partial data of the uniform sequence to the first lane. The 1:d converter 150 uses the remaining data of the uniform sequence and the data of the non-uniform sequence to divide the data into a predetermined code length. The 1:d converter 150 outputs the divided data to the second lane to the d-th lane. The data output to the second lane to the d-th lane is input to the bit conversion circuit 170.

The SD-FEC encoding unit 160 encodes partial data of a uniform sequence (step S107). The SD-FEC encoding unit 160 outputs the encoded data to the bit conversion circuit 170. The bit conversion circuit 170 converts the bit sequence of the input data (step S108). The dem converter 180 allocates the data of the uniform sequence output from the bit conversion circuit 170 to the LSB and the data of the non-uniform sequence to the MSBs (step S109). The symbol mapper 11 allocates a uniform sequence to the positive and negative of a symbol and a non-uniform sequence to the amplitude of the symbol to generate the transmission data (step S110). The transmission unit 12 transmits the generated transmission data (step S111).

With the transmission device 1 configured as described above, the CP-MLC can be incorporated into the PAS, and it is possible to achieve the FEC and PCS techniques with high frequency efficiency and low calculation amount regardless of the modulation multilevel degree.

Second Embodiment

In the first embodiment, the case where d≥m has been described. In the second embodiment, a case where d<m will be described.

Figure 9:
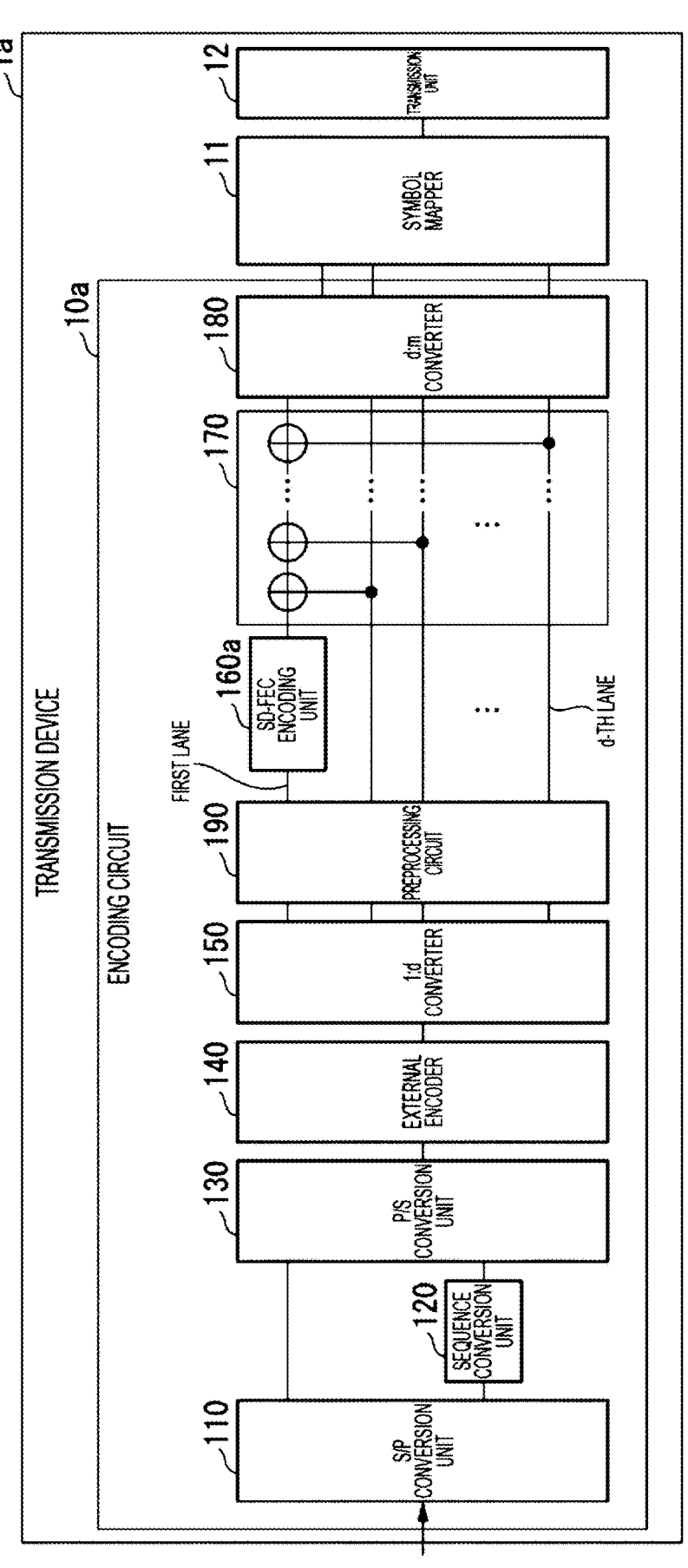
FIG. 9 is a block diagram illustrating a configuration example of a transmission device of a second embodiment.

FIG. 9 is a block diagram illustrating a configuration example of a transmission device 1*a* of the second embodiment. The transmission device 1*a* includes an encoding circuit 10*a*, a symbol mapper 11, and a transmission unit 12. The encoding circuit 10*a* includes an S/P conversion unit 110, a sequence conversion unit 120, a P/S conversion unit 130, an external encoder 140, a 1:d converter 150, an SD-FEC encoding unit 160*a*, a bit conversion circuit 170, a dem converter 180, and a preprocessing circuit 190.

The encoding circuit 10*a* is different from the encoding circuit 10 in that the SD-FEC encoding unit 160*a* is provided instead of the SD-FEC encoding unit 160 and the preprocessing circuit 190 is newly provided. Other configurations of the encoding circuit 10*a* are similar to those of the encoding circuit 10. Therefore, the SD-FEC encoding unit 160*a* and the preprocessing circuit 190 will be described.

The preprocessing circuit 190 performs preprocessing on data output from the 1:d converter 150 to each lane. Specifically, the preprocessing circuit 190 performs exclusive OR in advance on the bit sequences of the second lane and subsequent lanes to be added by the bit conversion circuit 170 only to non-uniform sequence bits used for amplitude among bits $b_1$ included in the uppermost subchannel.

The SD-FEC encoding unit 160*a* encodes the data to which the bits have been added by the preprocessing circuit 190. The SD-FEC encoding unit 160*a* sets a systematic code only when d<m.

Figure 10:
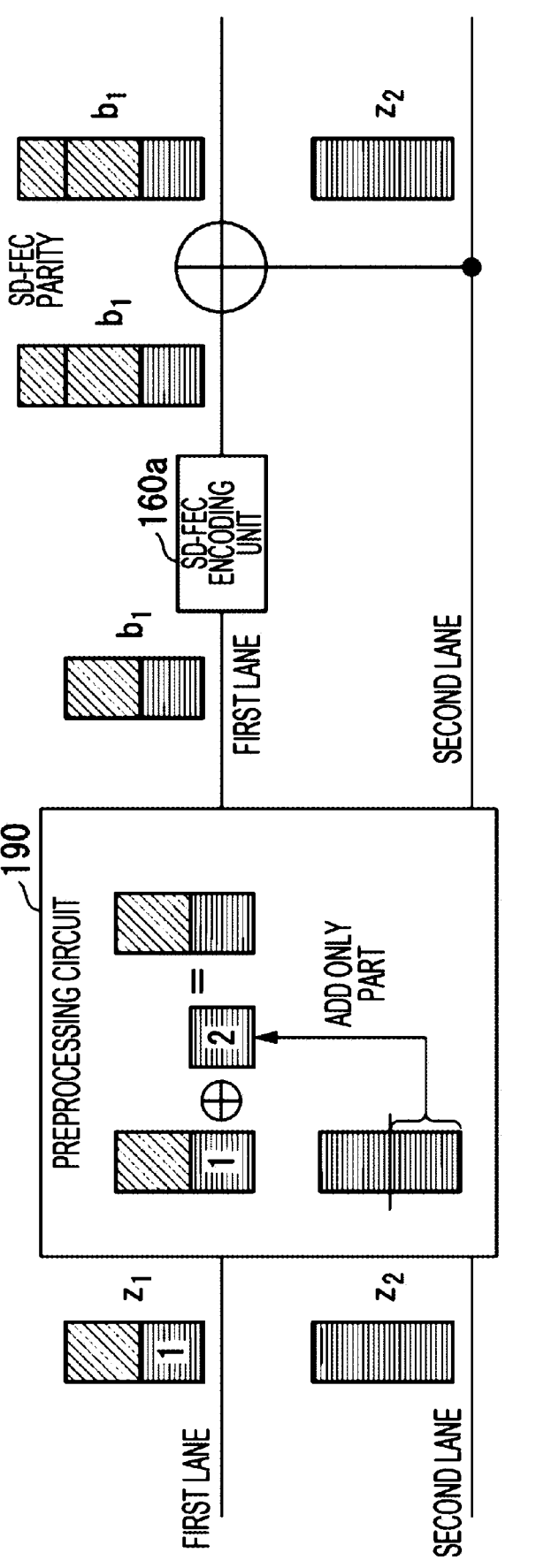
FIG. 10 is a diagram for describing details of processing performed by a preprocessing circuit included in the transmission device of the second embodiment.

FIG. 10 is a diagram for describing details of processing performed by the preprocessing circuit 190 included in the transmission device 1*a* of the second embodiment. In the example illustrated in FIG. 10, the number of lanes is 2 (d=2), and the number of bits per symbol is 4 (m=4). The preprocessing circuit 190 performs exclusive OR of the proportion of (m−1)/m−(d−1)/d with respect to the entire non-uniform sequence data input from the first lane. In the example illustrated in FIG. 10, the preprocessing circuit 190 adds ¼ of bits to the data input from the first lane. Since the exclusive OR is a reversible operation, by including the preprocessing circuit 190, it is possible to prevent the non-uniform sequence from collapsing due to the exclusive OR with the bit sequences of the second lane and subsequent lanes in the bit conversion circuit 170, and it is possible to make the reliability non-uniform by polarization while outputting the non-uniform sequence as it is.

Figure 11:
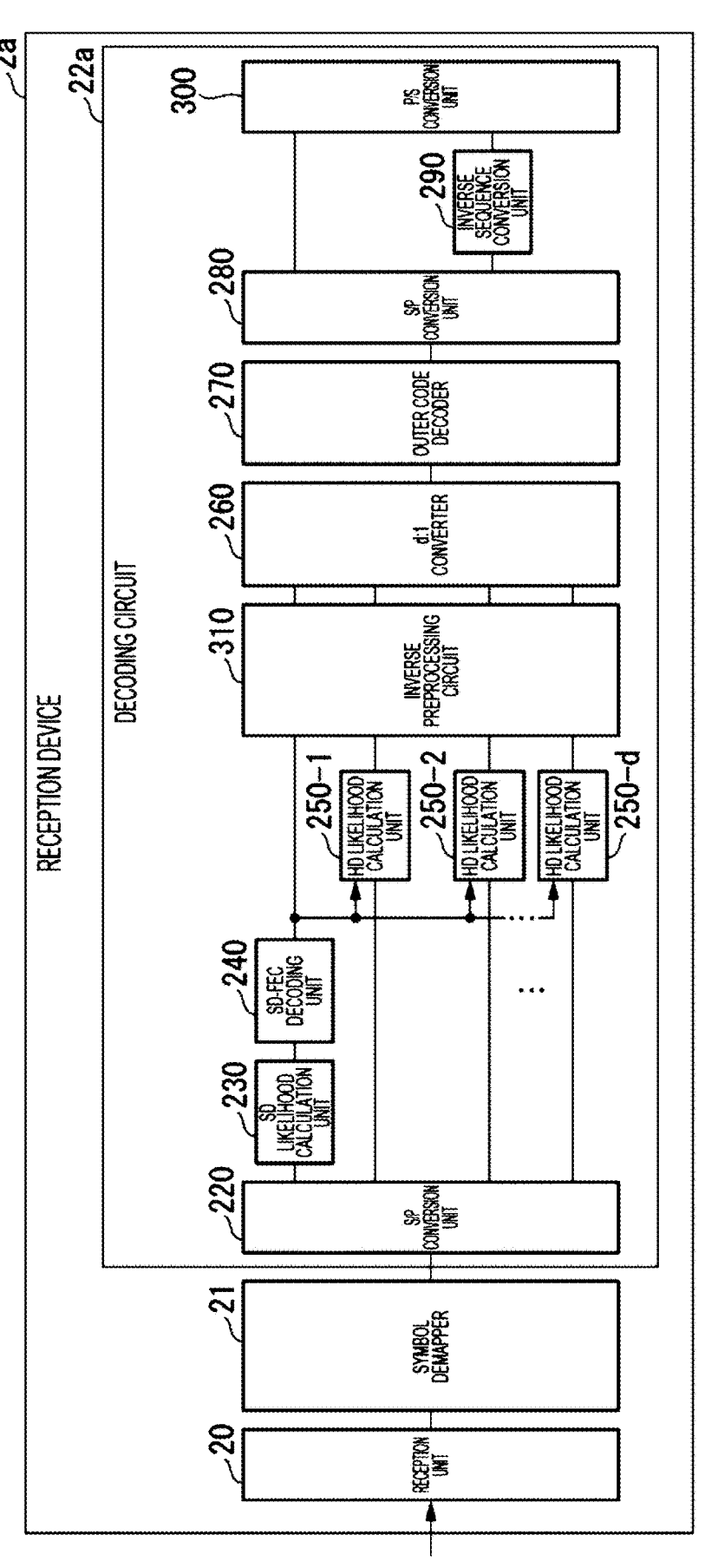
FIG. 11 is a block diagram illustrating a configuration example of a reception device of the second embodiment.

FIG. 11 is a block diagram illustrating a configuration example of a reception device 2*a* of the second embodiment. The reception device 2*a* includes a reception unit 20, a symbol demapper 21, and a decoding circuit 22*a*. The decoding circuit 22*a* includes an S/P conversion unit 220, an SD likelihood calculation unit 230, an SD-FEC decoding unit 240, a plurality of HD likelihood calculation units 250-1 to 250-*d*, a d:1 converter 260, an outer code decoder 270, an S/P conversion unit 280, an inverse sequence conversion unit 290, a P/S conversion unit 300, and an inverse preprocessing circuit 310.

The decoding circuit 22*a* is different from the decoding circuit 22 in that the inverse preprocessing circuit 310 is newly provided. Other configurations of the decoding circuit

22*a* are similar to those of the decoding circuit 22. Therefore, the inverse preprocessing circuit 310 will be described.

The inverse preprocessing circuit 310 performs reverse processing of the preprocessing circuit 190 in the encoding circuit 10*a*. As a result, the inverse preprocessing circuit 310 outputs a bit sequence corresponding to the amplitude as it is.

Figure 12:
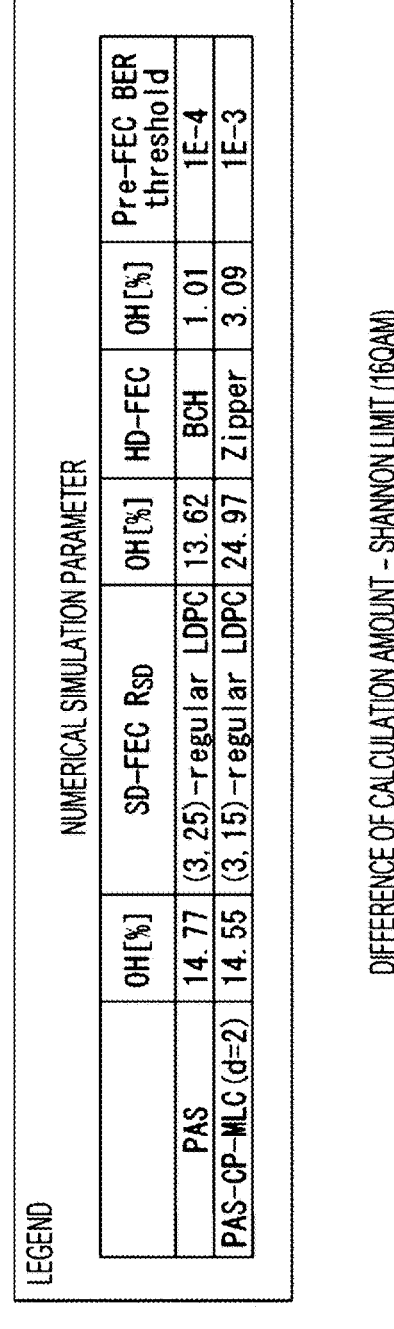
FIG. 12 is a diagram illustrating numerical simulation results of the present invention and a conventional PAS technique.
Figure 12:
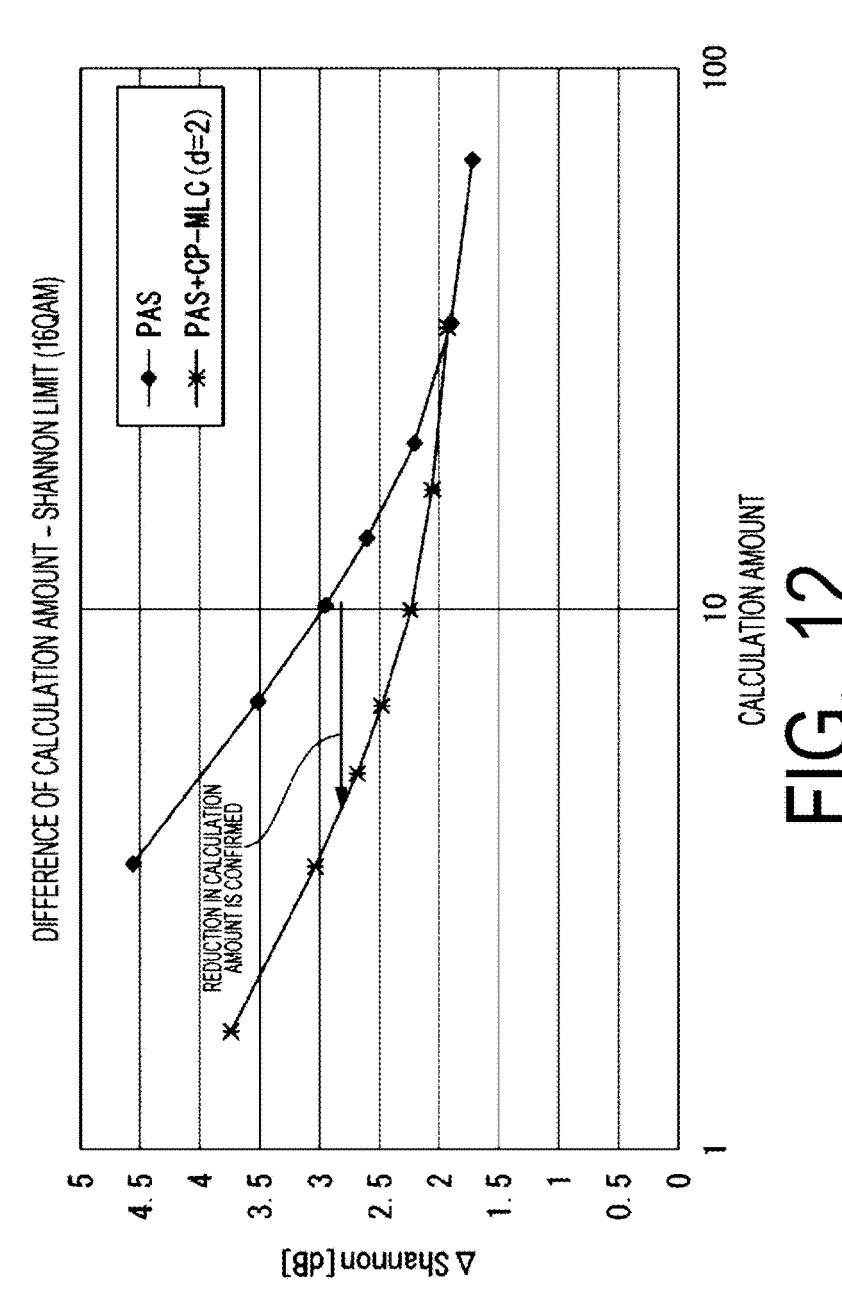

FIG. 12 is a diagram illustrating numerical simulation results of the present invention and a conventional PAS technique. In the example illustrated in FIG. 12, simulation was performed with numerical simulation parameters indicated in the legend. Note that "PAS" in FIG. 12 indicates a result in the case of using only the conventional PAS technique, and "PAS+CP-MLC (d=2)" indicates a result in the case of using the technique of the present invention. In the numerical simulation, the rSNR was evaluated, and the performance difference from the Shannon limit was evaluated by changing the number of iterations of sum-product decoding of the LDPC code from 1 to 20. Here, it is assumed that HD-FECs are virtually connected, and Es/No for achieving post FEC-BER that achieves pre-FEC BER threshold is defined as rSNR. The rate of the sequence conversion unit 120 is bit/amplitude=0.9. Based on Reference Literature 1 described below, the calculation amount was evaluated by Formula (5) described below. In addition, as the LDPC code to be used, a (3,15)-regular LDPC code with a row weight of 15 and a column weight of 3 and a (3,25)-regular LDPC code are used.

(Reference Literature 1:M. Barakatain, D. Lentner, G. Boecherer and F. R. Kschischang, "Performance-Complexity Tradeoffs of Concatenated FEC for Higher-Order Modulation", in Journal of Lightwave Technology, vol. 38, no. 11, pp. 2944-2953 Jun. 1, 2020, doi: 10.1109/JLT.2020.2983912.)

[Math. 5]

$$\eta_{CP} := \frac{(1 - R_{SD})(\overline{d}_c - v)I}{d - 1 + R_{SD}} + P, \tag{5}$$

(−)$d_c$ ((−) is on d) in Formula 5 indicates an average order of row weights of LDPC matrix, v indicates an average of variable nodes connected to each check node and having an order of 1 on a factor graph in sum-product decoding, and I indicates the number of iterations. It can be confirmed that the calculation amount is reduced as compared with the case of using only the conventional PAS.

Some functional units (for example, the encoding circuits 10 and 10*a*) included in the transmission devices 1 and 1*a* and some functional units (for example, the decoding circuits 22 and 22*a*) included in the reception devices 2 and 2*a* in the above-described embodiments may be implemented by a computer. In that case, a program for implementing this function may be recorded in a computer-readable recording medium, and the program recorded in the recording medium may be read and executed by a computer system to implement the function. Note that the "computer system" mentioned herein includes an OS and hardware such as peripheral devices. In addition, the "computer-readable recording medium" is a portable medium such as a flexible disk, a magneto-optical disc, ROM, or CD-ROM, or a storage device such as a hard disk embedded in the computer system. Further, the "computer-readable recording medium" may include a medium that dynamically holds the program for a short time, such as a communication line in a case where the program is transmitted via a network such as the Internet or a communication line such as a telephone line, and a medium that holds the program for a certain period of time, such as volatile memory inside a computer system serving as a server or a client in that case. In addition, the program described above may be for implementing some of the functions described above, may be implemented in a combination of the functions described above and a program already recorded in a computer system, or may be implemented with a programmable logic device such as a field programmable gate array (FPGA).

Although the embodiments of the present invention have been described in detail with reference to the drawings, specific configurations are not limited to the embodiments, and include design and the like within the scope of the present invention without departing from the gist of the present invention.

INDUSTRIAL APPLICABILITY

The present invention can be applied to a communication system using an encoder and a decoder.

REFERENCE SIGNS LIST

1a Transmission device
2a Reception device
10a Encoding circuit
20 Reception unit
21 Symbol demapper
22a Decoding circuit
110 S/P conversion unit
120 Sequence conversion unit
130 P/S conversion unit
140 External encoder
150 1:d converter
160 SD-FEC encoding unit
170 Bit conversion circuit
180 d:m converter
190 Preprocessing circuit
220 S/P conversion unit
230 SD likelihood calculation unit
240 SD-FEC decoding unit
250 HD likelihood calculation unit
260 d:1 converter
270 Outer code decoder
280 S/P conversion unit
290 Inverse sequence conversion unit
300 P/S conversion unit
310 Inverse preprocessing circuit

The invention claimed is:

1. An encoding circuit used for coherent digital signal processing, comprising:
   a serial-parallel circuit configured to perform serial-parallel conversion on input data of a uniform sequence to divide the data into a plurality of pieces of divided data;
   a sequence converter configured to encode the divided data and converts the encoded divided data into divided data of a non-uniform sequence;
   a parallel-serial circuit configured to convert the divided data output from the serial-parallel circuit and the divided data of the non-uniform sequence converted by the sequence converter into serial data by performing parallel-serial conversion;
   an external encoder configured to add an error correction code to the serial data and encodes the serial data;

a divider configured to divide the serial data to which the error correction code is added into a plurality of pieces of divided data;
   a bit conversion circuit configured to regard the plurality of pieces of divided data divided by the divider as data to be transmitted in different subchannels and converts a bit sequence to make a communication channel capacity of each subchannel non-uniform; and
   a converter configured to allocate data of a uniform sequence to a least significant bit and allocates data of a non-uniform sequence to a most significant bit by performing Gray labeling on the plurality of pieces of divided data output from the bit conversion circuit.

2. The encoding circuit according to claim 1, further comprising:
   a preprocessing circuit configured to output a bit sequence corresponding to amplitude as it is when a number of bits per symbol is larger than a number of divisions by the divider.

3. A decoding circuit used for coherent digital signal processing, comprising:
   a serial-parallel circuit configured to perform serial-parallel conversion on input data to divide the data into a plurality of pieces of divided data;
   a first likelihood calculation circuit configured to calculate a likelihood by soft decision on a basis of some pieces of divided data of the plurality of pieces of divided data and information of noise generated in a communication channel;
   a decoder configured to use the likelihood as an input and corrects an error of the divided data input to the first likelihood calculation circuit;
   one or more second likelihood calculation circuits configured to calculate a likelihood related to a conditional probability on a basis of a code word error-corrected by the decoder, some pieces of divided data of the plurality of pieces of divided data, and information of noise generated in the communication channel, and makes a hard decision;
   a combiner configured to combine an obtained bit sequence and a decoded information bit;
   an outer code decoder configured to decode an outer code;
   a serial-parallel circuit configured to perform serial-parallel conversion on input data to divide the data into divided data of a uniform sequence and divided data of a non-uniform sequence;
   a sequence converter configured to decode the divided data of the non-uniform sequence and converts the divided data into divided data of a uniform sequence; and
   a parallel-serial circuit configured to perform parallel-serial conversion on the divided data of the uniform sequence output from the sequence converter and the divided data of the uniform sequence divided to restore the data of the uniform sequence,
   the decoding circuit further comprising:
   an inverse preprocessing circuit configured to output a bit sequence corresponding to amplitude as it is when a number of bits per symbol is larger than a number of divisions by the serial-parallel circuit.

4. A non-transitory computer readable storage medium that stores a computer program to be executed by the computer;
   performing serial-parallel conversion on input data to divide the data into a plurality of pieces of divided data;

calculating a likelihood by soft decision on a basis of some pieces of divided data of the plurality of pieces of divided data and information of noise generated in a communication channel;

using the likelihood as an input and correcting an error of the divided data;

calculating a likelihood related to a conditional probability on a basis of a code word error-corrected, some pieces of divided data of the plurality of pieces of divided data, and information of noise generated in the communication channel, and making a hard decision;

combining an obtained bit sequence and a decoded information bit;

decoding an outer code;

performing serial-parallel conversion on input data to divide the data into divided data of a uniform sequence and divided data of a non-uniform sequence;

decoding the divided data of the non-uniform sequence and converting the divided data into divided data of a uniform sequence; and performing parallel-serial conversion on the divided data of the uniform sequence converted and the divided data of the uniform sequence divided to restore the data of the uniform sequence, outputting a bit sequence corresponding to amplitude as it is when a number of bits per symbol is larger than a number of divisions by the serial-parallel conversion.

5. An encoding method used for coherent digital signal processing, comprising:

performing serial-parallel conversion on input data of a uniform sequence to divide the data into a plurality of pieces of divided data;

encoding the divided data and converting the encoded divided data into divided data of a non-uniform sequence;

converting the divided data and the divided data of the non-uniform sequence into serial data by performing parallel-serial conversion;

adding an error correction code to the serial data and encoding the serial data;

dividing the serial data to which the error correction code is added into a plurality of pieces of divided data;

regarding the plurality of pieces of divided data divided as data to be transmitted in different subchannels and converting a bit sequence to make a communication channel capacity of each subchannel non-uniform; and allocating data of a uniform sequence to a least significant bit and allocating data of a non-uniform sequence to a most significant bit by performing Gray labeling on the plurality of pieces of divided data.

6. A decoding method used for coherent digital signal processing, comprising:

performing serial-parallel conversion on input data to divide the data into a plurality of pieces of divided data;

calculating a likelihood by soft decision on a basis of some pieces of divided data of the plurality of pieces of divided data and information of noise generated in a communication channel;

using the likelihood as an input and correcting an error of the divided data;

calculating a likelihood related to a conditional probability on a basis of a code word error-corrected, some pieces of divided data of the plurality of pieces of divided data, and information of noise generated in the communication channel, and making a hard decision;

combining an obtained bit sequence and a decoded information bit;

decoding an outer code;

performing serial-parallel conversion on input data to divide the data into divided data of a uniform sequence and divided data of a non-uniform sequence;

decoding the divided data of the non-uniform sequence and converting the divided data into divided data of a uniform sequence; and performing parallel-serial conversion on the divided data of the uniform sequence converted and the divided data of the uniform sequence divided to restore the data of the uniform sequence, the decoding method further comprising:

outputting a bit sequence corresponding to amplitude as it is when a number of bits per symbol is larger than a number of divisions by the serial-parallel conversion.

7. A non-transitory computer readable storage medium that stores a computer program to be executed by the computer;

performing serial-parallel conversion on input data of a uniform sequence to divide the data into a plurality of pieces of divided data;

encoding the divided data and converting the encoded divided data into divided data of a non-uniform sequence;

converting the divided data and the divided data of the non-uniform sequence into serial data by performing parallel-serial conversion;

adding an error correction code to the serial data and encoding the serial data;

dividing the serial data to which the error correction code is added into a plurality of pieces of divided data;

regarding the plurality of pieces of divided data divided as data to be transmitted in different subchannels and converting a bit sequence to make a communication channel capacity of each subchannel non-uniform; and allocating data of a uniform sequence to a least significant bit and allocating data of a non-uniform sequence to a most significant bit by performing Gray labeling on among the plurality of pieces of divided data.

* * * * *